(12) United States Patent
Son

(10) Patent No.: US 8,044,301 B2
(45) Date of Patent: Oct. 25, 2011

(54) PRINTED CIRCUIT BOARD PROVIDED WITH HEAT CIRCULATING MEDIUM AND METHOD FOR MANUFACTURING THE SAME

(75) Inventor: Jae Hyun Son, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1056 days.

(21) Appl. No.: 11/777,029

(22) Filed: Jul. 12, 2007

(65) Prior Publication Data
US 2008/0286531 A1 Nov. 20, 2008

(30) Foreign Application Priority Data
May 15, 2007 (KR) .................. 10-2007-0047017

(51) Int. Cl.
*H05K 1/03* (2006.01)
*H05K 3/02* (2006.01)
(52) U.S. Cl. ........... 174/255; 174/261; 174/267; 29/847
(58) Field of Classification Search .............. 174/252, 174/255, 261, 267; 29/846–852
See application file for complete search history.

(56) References Cited

U.S. PATENT DOCUMENTS

| 5,283,715 A | 2/1994 | Carlsten et al. |
| 7,626,260 B2 * | 12/2009 | Chung et al. ............ 257/712 |

FOREIGN PATENT DOCUMENTS

| JP | 2003-329379 | | 11/2003 |
| JP | 2007-027466 | | 2/2007 |
| JP | 2007-043013 | A | 2/2007 |
| KR | 1020030087646 | A | 11/2003 |
| KR | 1020050004134 | A | 1/2005 |
| KR | 1020050117482 | A | 12/2005 |

* cited by examiner

*Primary Examiner* — Jeremy Norris
(74) *Attorney, Agent, or Firm* — Ladas & Parry LLP

(57) ABSTRACT

A printed circuit board includes a lower plate provided with an internal circuit wiring and having a recessed part at a surface thereof and a plurality of projection patterns at a lower surface of the recessed part; an upper plate having the same structure of the lower plate and adhered to the lower plate so that surfaces formed with the recessed part are opposite to each other; a heat circulation medium injected into an internal space formed by the recessed parts of the lower and upper plates.

15 Claims, 3 Drawing Sheets

PRINTED CIRCUIT BOARD PROVIDED WITH HEAT CIRCULATING MEDIUM AND METHOD FOR MANUFACTURING THE SAME

CROSS-REFERENCE TO RELATED APPLICATIONS

The present application claims priority to Korean patent application number 10-2007-0047017 filed on May 15, 2007, which is incorporated herein by reference in its entirety.

BACKGROUND OF THE INVENTION

The present invention relates to a printed circuit board, and more particularly to a printed circuit board provided with a heat circulating medium, and a method for manufacturing the same.

The recent trend in the electronic industry for mounting techniques utilizes printed circuit boards (PCBs) for high density and high accuracy mounting of mounting parts employed to achieve a miniaturization and a high performance of an electronic machine. Particularly, high density PCBs capable of mounting more memory parts such as semiconductor packages are gaining attention as the chip size package (CSP) technique such as a ball grid array (BGA) and a tape carrier package (TCP) is developed. Therefore, a PCB which allows a high density mounting of memory parts is an important aspect of the technique for accomplishing a light-weight, small sized electronic machine among others such as micromachining of the part that are to be mounted on the PCB.

A PCB refers to a board having an insulation layer formed with a circuit wiring using a conductive material such as copper and accommodates mounting parts to be mounted thereon when constructing a module.

Hereinafter, a conventional PCB will be briefly described with reference to FIG. 1.

As shown, a PCB 100 includes an insulation layer 110 formed of a resin based material and a conductive circuit wiring 120. The PCB 100 has a structure in which at least one of the insulation layer 110 and the circuit wiring 120 are alternately laminated. A via type internal circuit wiring 122 is also formed in the insulation layer 110 in order to connect electrically the upper and lower circuit wirings 120, which are both disposed in the insulation layer 110. In order to form a ball land and a bump pad, the upper and lower layers of the insulation layer 110 are patterned to expose portions of the circuit wiring 120 as shown in FIG. 1.

However, in a conventional PCB as shown in FIG. 1, hot spots are generated due to the differences in the level of power consumption between parts such as the semiconductor packages that are mounted on the PCB to construct a memory module, a mother board for a PC, a graphic card for PC, and the like. Further, the circuitry malfunction may be caused by the rising PCB temperature due to the diffusion resistance resulting from the generation of hot spots. Thus, the rise of PCB temperature due to localized hot spots may lead to the system failure or poor operation of the system.

Particularly, the thermal conductivity of an insulation layer in a conventional PCB is generally low. As the conventional PCBs rely on the conductive layer that is relatively smaller in portion than the insulation layer for heat dissipation, the issue of potential system failure due to the rising temperature of the PCB will be more problematic as even greater number of semiconductor packages are mounted on a PCB in a high performance electronic machine.

BRIEF SUMMARY OF THE INVENTION

Embodiments of the present invention are directed to a PCB provided with a heat circulation medium capable of preventing temperature rising, and a method for manufacturing the same.

Further, embodiments of the present invention are directed to a PCB, capable of preventing temperature rising and thus adapted to realize a high performance electronic machine, and a method for manufacturing the same.

In one embodiment, a PCB may comprise a lower plate provided with an internal circuit wiring and having a recessed part at a surface thereof and a plurality of projection patterns at a lower surface of the recessed part; an upper plate having the same structure of the lower plate and adhered to the lower plate so that surfaces formed with the recessed part are opposite to each other; and a heat circulation medium injected into an internal space formed by the recessed parts of the lower and upper plates.

The projection pattern has a width of 10 to 100 µm and a height of 10 to 100 µm.

The lower and upper plates are provided with electrode terminals exposed on the other surfaces thereof respectively.

The heat circulation medium is a fluid including one of water, ethanol and ammonium.

The PCB may further comprise a sealer interposed between the lower and the upper plates to adhere them.

In another embodiment, a method for manufacturing a PCB may comprise etching a surface of a lower plate having an internal circuit wiring to form a recessed part; etching a lower surface of the recessed part of the lower plate formed with the recessed part to form a plurality of projection patterns; adhering an upper plate provided with an internal circuit wiring and having a recessed part at a surface thereof and a plurality of projection patterns at a lower surface of the recessed part as same as the lower plate to the lower plate so that surfaces formed with the recessed part are opposite to each other; and injecting a heat circulation medium into an internal space formed by the recessed parts of the lower and upper plates.

The projection pattern has a width of 10 to 100 µm and a height of 10 to 100 µm.

The lower and upper plates are provided with electrode terminals exposed on the other surfaces thereof respectively.

The heat circulation medium is a fluid including one of water, ethanol, and ammonium.

The lower and the upper plates are adhered to each other using a sealer.

The adhesion of the lower and the upper plates using the sealer may comprise sealing mainly all other parts except for a contact part between the lower and the upper plates; injecting the heat circulation medium using an osmotic manner through a part which is not sealed between the lower and the upper plates; and sealing the part not sealed between the lower and the upper plates.

DESCRIPTION OF SPECIFIC EMBODIMENTS

A preferred embodiment of the present invention is directed to a PCB having an upper plate provided with an internal circuit wiring and a lower plate provided with an internal circuit wiring, in which recessed parts are formed on each surface of the upper plate and the lower plate such that the surfaces of the upper and lower plates provided with the recessed parts are adhered to each other so that a heat circulation medium (e.g., a fluid) is injected into the cavities formed by the recessed parts.

Accordingly, the temperature rising in the localized sections of the PCB is prevented by spreading the heat to the entire PCB by circulating the injected heat circulation medium undergoing the cycles of vaporization, movement, condensation and return, thereby lowering the localized high temperatures found on the PCB. Therefore, the PCB made in accordance with an embodiment of the present invention has an enhanced heat radiation property for effective lowering of higher temperatures in the localized sections of the PCB.

Figure 1:
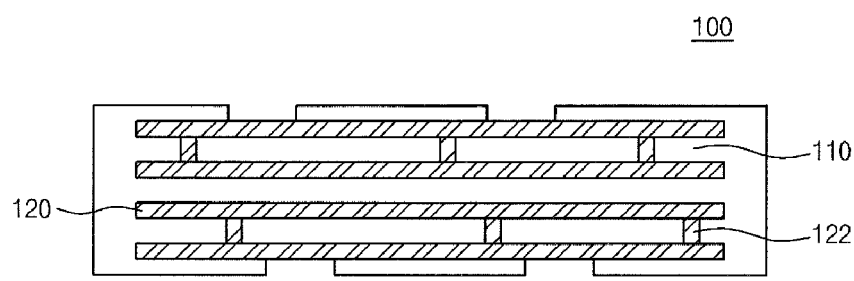
FIG. 1 is a cross-sectional view illustrating a conventional PCB.
Figure 2:
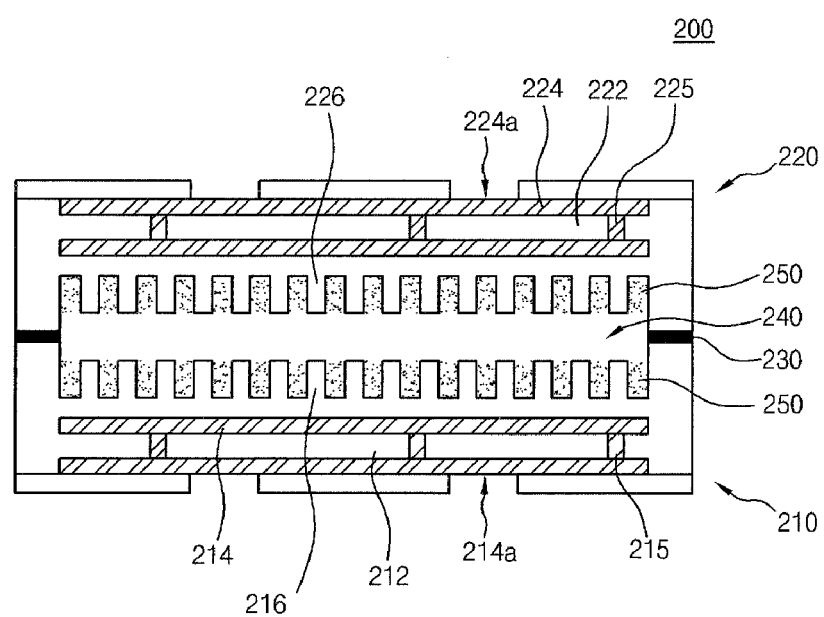
FIG. 2 is a cross-sectional view illustrating a PCB in accordance with an embodiment of the present invention.

FIG. 2 is a cross-sectional view of a PCB 200 shown in accordance with an embodiment of the present invention.

As shown, the PCB 200 includes a lower plate 210 and an upper plate 220. Each of the lower and upper plates 210, 220 has at least one layer of the insulation layer 212, 222 made of a resin based material and the conductive circuit wirings 214, 224 laminated thereon respectively. The lower plate 210 and the upper plate 220 are formed with electrodes 214a and 224a respectively which are exposed to the outer surface thereof. The lower plate 210 and the upper plate 220 includes a plurality of projection patterns 216 and 226 respectively formed on the opposite surface of the outer surface having the electrodes 214a or 224a such that the surfaces of the lower and upper plates 210, 220 having the projection patterns 215, 226 are adhered to each other using a sealer 230 to form the internal space 240. Thus, the surfaces formed with the projection patterns 216 and 226 oppose each other.

A heat circulation medium such as a working fluid 250 is injected into the internal space 240 formed between the lower and upper plates 210 and 220 adhered to each other. Water, ethanol, ammonium or the like may be used as the working fluid 250.

The projection patterns 216 and 226 in the lower and upper plates 210 and 220 are structures for return of the working fluid and have a width of 10 to 100 μm and a height of 10 to 100 μm. The projection patterns 216 and 226 can be obtained through a conventional etching process.

Meanwhile, though not shown, some of the projection patterns 216 and 226 in the lower and upper plates 210 and 220 may be formed to come in contact with each other, and a circuit wiring for connecting the upper plate 220 and the lower plate 210 may be formed within the structure, and thus the upper plate 220 and the lower plate 210 are electrically connected with each other by the circuit wiring.

In such a PCB provided in accordance with an embodiment of the present invention, localized high temperature conditions are easily eliminated by circulation of the working fluid injected into the internal space (such as 240 in FIG. 2) undergoing cycles of vaporization, movement, condensation, and return in response to the rising temperature of the PCB on localized areas, unlike a conventional PCB which radiates heat only by a conductive circuit wiring.

Reference symbols 215 and 225 in FIG. 2 denote the internal circuit wirings.

FIGS. 3A through 3D are cross-sectional views illustrating the process steps of a method for manufacturing the PCB in accordance with an embodiment of the present invention.

Figure 3A:
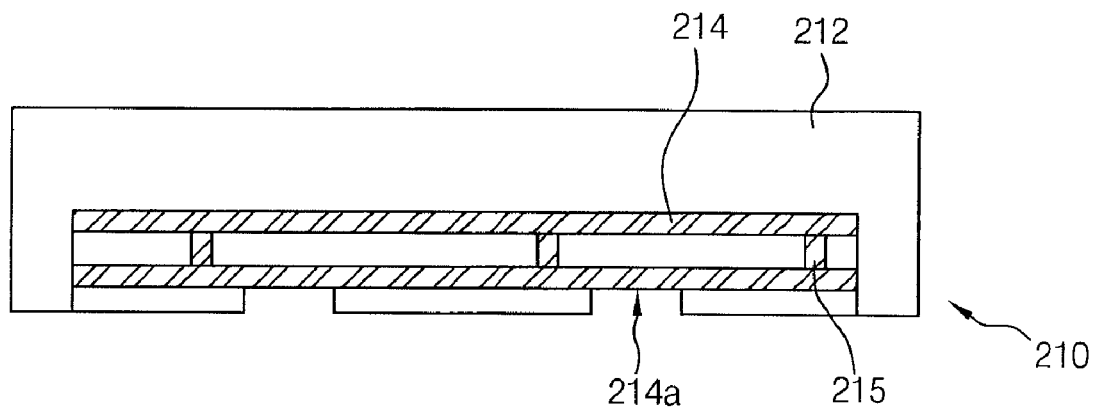
FIGS. 3A through 3D are cross-sectional views illustrating the process steps of a method for manufacturing the PCB in accordance with an embodiment of the present invention.

Referring to FIG. 3A, a lower plate 210 is prepared, in which the insulation layer 212 of a resin based material and the conductive circuit wiring 214 relatively thinner than the insulation layer 212 are alternately laminated to form at least one layer. In a multiplayer structure, the internal circuit wiring 215 connects two conductive circuit wirings 214. The thick insulation layer 212 is disposed over one surface of the lower plate 210 and the other surface is patterned so that one or more portions of the conductive wiring is exposed to form at least one electrode terminal 214a. In order to connect electrically in a multilayered structure of the conductive wirings 214 laminated on the insulation layer 212, a via type internal circuit wiring 215 which passes through the insulation layer 212 is formed.

Figure 3B:
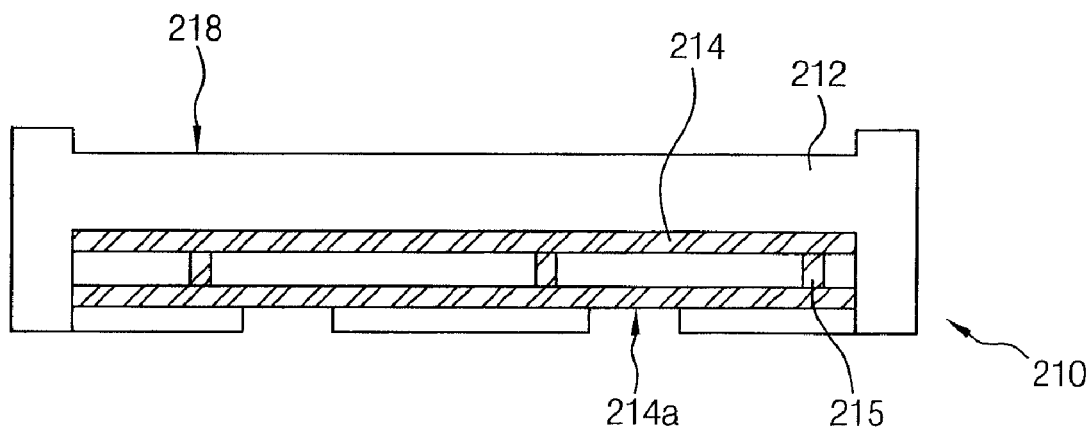

Referring to FIG. 3B, the surface of the lower plate 210 formed of the thick insulation layer 212 is etched to form a recessed part 218. The depth of the recessed part 218 may vary based on the usage and characteristic of the PCB 200.

Figure 3C:
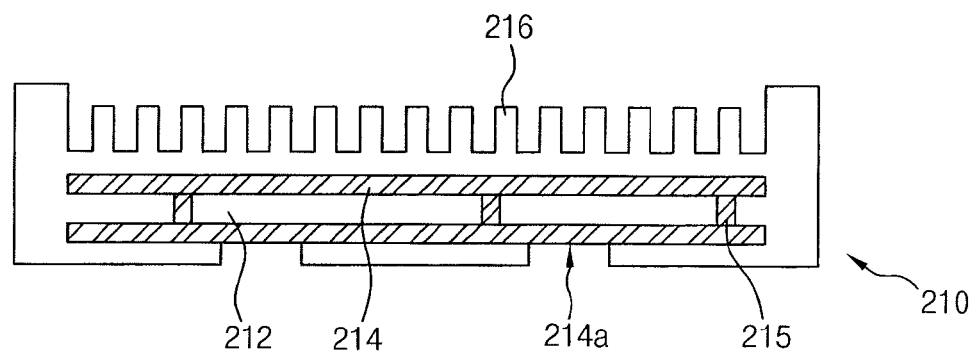

Referring to FIG. 3C, the etched lower surface of the recessed part 218 having the insulation layer 212 is etched again to form a plurality of projection patterns 216. The projection patterns 216 in an embodiment of the present invention are formed as so to have a height of 10 to 100 μm and a width of 10 to 100 μm. However, it should be readily understood that the height and the width of the projection patterns 216 may vary depending on the usage and characteristics thereof.

Figure 3D:
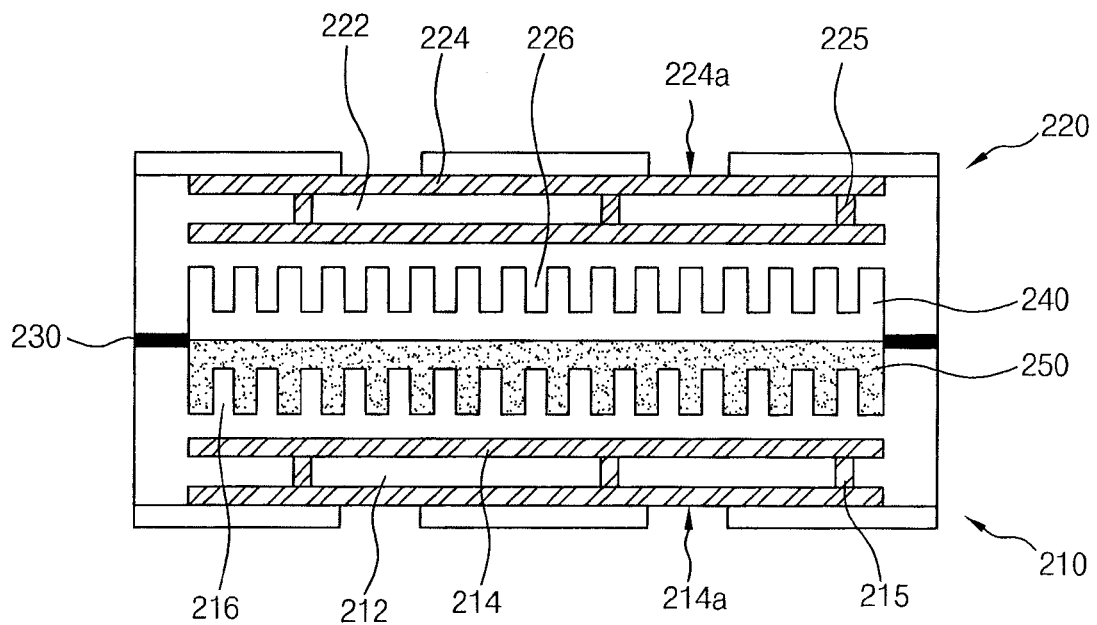

Referring to FIG. 3D, an upper plate 220 is prepared to have the same structure as the lower plate 210 formed with the projection pattern 216 in the same manner described above with reference to FIG. 3C. That is, the upper plate 220 includes an insulation layer 222, a conductive circuit 224, a via type internal circuit wiring 225. The insulation layer 222 has the recessed parts formed by a plurality of projection patterns 226 on one surface thereof. On the other side of the upper plate 220 opposite of the side having the projection patterns 226 is formed with at least one exposed electrode terminal 224a. The lower plate 210 and the upper plate 220 are adhered using a sealer 230 or other suitable techniques so that the surfaces formed with the projection patterns 216 and 226 oppose each other. The lower plate 210 and the upper plate 220 are adhered to completely seal the internal space 240, except for a certain contact part through which a working fluid 250 can be injected into the internal space 240.

A heat circulation medium such as a working fluid 250 is then injected in an osmotic manner through the contact part into the internal space 240 formed by the adhesion of the lower plate 210 and the upper plate 220, and then the contact part is sealed, thereby completing a manufacture of the PCB provided with a heat circulation medium in accordance with an embodiment of the present invention.

Water, ethanol, ammonium or the like may be used as the working fluid 250.

Hereinafter, an operation of the working fluid 250 of the PCB provided with a heat circulation medium in accordance with an embodiment of the present invention will be described.

After a plurality of semiconductor packages are mounted on the PCB, certain localized areas on the PCB may heat up due to the power consumption of the mounted semiconductor packages. This would create localized hot spots on the PCB having the higher temperature, and the temperature in these hot spots are lowered by the vaporizing working fluid inside the internal space 240 of the PCB maintained in a low pressure.

Then, the working fluid 250 undergo condensation in other parts of the PCB that are not hot spots where the temperature is relatively low, and the heated working fluid affected by the hot spots moves to the condensation part due to the pressure difference between the two portions.

In addition, the working fluid moved to the condensation part as described above is returned to the heating part by a capillary phenomenon in the projection patterns 216, 226 formed in the internal space 240 of the PCB. As the working fluid 250 undergoes cycles of vaporization, movement, condensation, and return, the heat generated from the heated parts corresponding to the hot spots is rapidly moved to the condensation part, and thus the temperature of the PCB can be maintained uniformly over the entire PCB.

Meanwhile, though not shown in FIG. 3D, it may be possible that some of the projection patterns 216 and 226 in the lower and upper plates 210 and 220 are formed to come in contact with each other, and a circuit wiring for connecting the upper plate 220 and the lower plate 210 is formed in the contacting structure, thereby electrically connecting the upper plate 220 and the lower plate 210 to each other by the circuit wiring.

In the present invention, by forming a space inside the PCB and injecting a heat circulation medium of a working fluid into the space inside the PCB, a uneven temperature rise in different parts of the PCB can be easily eliminated by circulation of the working fluid.

As is apparent from the above description, in an embodiment of the present invention, since a space is formed inside a PCB and a heat circulation medium such as a working fluid is injected into the space, uneven temperature rise in different parts of the PCB is lowered by spreading the heat to the entire PCB by circulating the working fluid undergoing cycles of vaporization, movement, condensation, and return, thereby maintaining the temperature of the PCB uniformly over the entire PCB. Therefore, a heat radiation property of the PCB can be enhanced.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A printed circuit board comprising:
    a lower plate having a first surface and a second surface opposite to each other, the lower plate comprising:
    an internal circuit wiring inside the lower plate;
    a recessed part formed on the second surface of the lower plate; and
    a plurality of projection patterns formed in the recessed part on the second surface of the lower plate, wherein an uppermost portion of the projection patterns is recessed from the second surface of the lower plate;
    an upper plate having the same structure as the lower plate, wherein the second surface of the upper plate formed with a plurality of projection patterns in the respective recessed part is adhered to the second surface of the lower plate also formed with a plurality of projection patterns in the respective recessed part to form an internal space inside the printed circuit board;
    a heat circulation medium injected into the internal space inside the printed circuit board.

2. The printed circuit board according to claim 1, wherein each projection pattern has a width of 10 to 100 μm.

3. The printed circuit board according to claim 1, wherein each projection pattern has a height of 10 to 100 μm.

4. The printed circuit board according to claim 1, wherein one or more electrode terminals are formed on portions of the internal circuit wiring exposed on the first surface of each of the lower and upper plates.

5. The printed circuit board according to claim 1, wherein the heat circulation medium is a fluid.

6. The printed circuit board according to claim 5, wherein the fluid includes at least one or more of water, ethanol, and ammonium.

7. The printed circuit board according to claim 1, wherein the lower and upper plates are adhered to each other using a sealer.

8. A method for manufacturing a printed circuit board comprising a lower plate and a upper plate, each plate having a first surface and a second surface, the method comprising the steps of:
    etching a portion of the second surface of the lower plate having an internal circuit wiring therein to form a lower recessed part;
    etching the lower recessed part to form a plurality of projection patterns;
    etching a portion of the second surface of the upper plate having an internal circuit wiring therein to form a upper recessed part;
    etching the upper recessed part to form a plurality of projection patterns, wherein an uppermost portion of the projection patterns is recessed from the second surface of the lower plate;
    adhering the second surface of the upper plate and the second surface of the lower place to form an internal space therebetween; and
    injecting a heat circulation medium into the internal space formed by the lower and upper recessed parts of the lower and upper plates.

9. The method for manufacturing a printed circuit board according to claim 8, wherein each projection pattern has a width of 10 to 100 μm.

10. The method for manufacturing a printed circuit board according to claim 8, wherein each projection pattern has a height of 10 to 100 μm.

11. The method for manufacturing a printed circuit board according to claim 8, one or more electrode terminals are formed on portions of the internal circuit wiring exposed on the first surface of each of the lower and upper plates.

12. The method for manufacturing a printed circuit board according to claim 8, wherein the heat circulation medium is a fluid.

13. The method for manufacturing a printed circuit board according to claim 12, wherein the fluid includes at least one or more of water, ethanol, and ammonium.

14. The method for manufacturing a printed circuit board according to claim 8, wherein the lower and the upper plates are adhered to each other using a sealer.

15. The method for manufacturing a printed circuit board according to claim 8, wherein the adhesion of the lower and the upper plates using the sealer comprises the steps of:
    sealing the lower and upper recessed parts except for a fluid injection part to form the internal space;
    injecting the heat circulation medium into the internal space using an osmotic manner through the unsealed fluid injection part; and
    after injecting the heat circulation medium into the internal space, sealing the unsealed fluid injection part.

* * * * *